(12) United States Patent
Park

(10) Patent No.: US 12,520,662 B2
(45) Date of Patent: Jan. 6, 2026

(54) ORGANIC LIGHT EMITTING DISPLAY APPARATUS

(71) Applicant: LG Display Co., Ltd., Seoul (KR)

(72) Inventor: SeHong Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 560 days.

(21) Appl. No.: 17/903,577

(22) Filed: Sep. 6, 2022

(65) Prior Publication Data

US 2023/0157063 A1    May 18, 2023

(30) Foreign Application Priority Data

Nov. 16, 2021 (KR) .................... 10-2021-0157767

(51) Int. Cl.
*H10K 50/86* (2023.01)
*H10K 59/124* (2023.01)

(52) U.S. Cl.
CPC .......... *H10K 50/86* (2023.02); *H10K 59/124* (2023.02)

(58) Field of Classification Search
CPC ........ H10K 50/84; H10K 50/85; H10K 50/86; H10K 50/805–828; H10K 50/813; H10K 59/124; H10K 59/80515; H10K 59/80521; H10K 59/879; H10K 59/35; H10K 2102/10–20; H10K 2102/00–361; H10K 50/822; H10K 50/868; H10K 50/854; H10K 50/858; H10K 50/00–88; H10K 59/00–95
See application file for complete search history.

(56) References Cited

U.S. PATENT DOCUMENTS

| 9,978,819 B2 | 5/2018 | Jang et al. |
| 10,319,796 B2 | 6/2019 | Jang et al. |
| 10,608,063 B2 | 3/2020 | Jang et al. |
| 10,886,350 B2 | 1/2021 | Jang et al. |
| 11,049,919 B2 | 6/2021 | Jang et al. |
| 2012/0038266 A1 | 2/2012 | Moriyama et al. |
| 2015/0380466 A1 | 12/2015 | Koo et al. |

(Continued)

FOREIGN PATENT DOCUMENTS

| CN | 113437238 A | * 9/2021 |
| DE | 102016117918 A1 | 3/2017 |

(Continued)

OTHER PUBLICATIONS

European Patent Office, Extended European Search Report and Opinion, EP Patent Application No. 22194325.1, Mar. 17, 2023, ten pages.

(Continued)

*Primary Examiner* — Steven B Gauthier
*Assistant Examiner* — Adam D Weiland
(74) *Attorney, Agent, or Firm* — Fenwick & West LLP

(57) ABSTRACT

An organic light emitting display apparatus is provided, which comprises a subpixel including a light emission area, a planarization layer that overlaps the light emission area and includes a plurality of light extraction patterns having a plurality of convex portions and a plurality of concave portions, a light control pattern alternately disposed in the plurality of concave portions of the plurality of light extraction patterns, and a light emitting element disposed on the plurality of light extraction patterns and the light control pattern.

23 Claims, 10 Drawing Sheets

(56) References Cited

U.S. PATENT DOCUMENTS

| | | | |
|---|---|---|---|
| 2017/0084676 A1 | 3/2017 | Jang et al. | |
| 2017/0117444 A1* | 4/2017 | Stoll | H10K 50/86 |
| 2018/0190932 A1* | 7/2018 | Koo | H10K 59/80515 |
| 2018/0212198 A1* | 7/2018 | Inoue | H10K 50/814 |
| 2018/0247987 A1 | 8/2018 | Jang et al. | |
| 2019/0096976 A1 | 3/2019 | Jang et al. | |
| 2019/0165323 A1* | 5/2019 | Jo | H10K 50/81 |
| 2019/0267439 A1 | 8/2019 | Jang et al. | |
| 2020/0194523 A1 | 6/2020 | Jang et al. | |
| 2022/0140019 A1* | 5/2022 | Park | H10K 59/353 |
| | | | 257/40 |
| 2022/0199948 A1* | 6/2022 | Yeo | H10K 59/8731 |

FOREIGN PATENT DOCUMENTS

| | | |
|---|---|---|
| EP | 3462513 A1 | 4/2019 |
| KR | 10-2015-0077261 A | 7/2015 |
| KR | 10-2018-0003967 A | 1/2018 |

OTHER PUBLICATIONS

Korean Intellectual Property Office, Office Action, Korean Patent Application No. 10-2021-0157767, Jan. 7, 2025, nine pages.

* cited by examiner

ORGANIC LIGHT EMITTING DISPLAY APPARATUS

CROSS-REFERENCE TO RELATED APPLICATION

This application claims the benefit of the Republic of Korea Patent Application No. 10-2021-0157767 filed on Nov. 16, 2021, which is hereby incorporated by reference in its entirety.

BACKGROUND

Field of Technology

The present disclosure relates to an organic light emitting display apparatus, and more particularly, to an organic light emitting display apparatus that may reduce reflectance due to external light while increasing internal light extraction efficiency.

Discussion of the Related Art

With the advancement of the information age, attention and demand for a display apparatus for displaying an image have increased in various forms and thus a display field has been rapidly developed. Therefore, various types of flat panel display apparatuses that are lightweight and thin have been developed and spotlighted. Recently, display apparatuses such as a liquid crystal display apparatus and an organic light emitting display apparatus have been used.

Since the organic light emitting display apparatus is a self-light emitting display apparatus and displays an image on a display panel through light emission of an organic light emitting layer interposed between two electrodes, it does not require a separate light source such as a backlight unit unlike a liquid crystal display apparatus, thereby capable of being fabricated to be lightweight and thin. Also, since the organic light emitting display apparatus is not only advantageous in view of power consumption due to low voltage driving but also excellent in color implementation, response speed, viewing angle, and contrast ratio, it has been spotlighted as a next-generation display apparatus.

The organic light emitting display apparatus displays an image by emitting internal light to the outside of the display apparatus, and studies for increasing efficiency of the internal light are ongoing. However, as reflectance is increased due to external light, it is difficult to improve efficiency of the internal light, whereby studies for deteriorating reflective visibility are also ongoing.

SUMMARY

The present disclosure has been formed in view of the above problems and it is an object of the present disclosure to provide an organic light emitting display apparatus that may improve light extraction efficiency by emitting light, which may be trapped inside without being emitted to the outside, to the outside when light is emitted from an organic light emitting layer to the outside to display an image.

It is another object of the present disclosure to provide an organic light emitting display apparatus that may solve black gap or reflective visibility, which are caused by external light reflection, and may solve Rainbow Mura as incident external light may be prevented from being emitted after being reflected inside or may be prevented from being emitted by increase of reflectance due to a reflective electrode.

In addition to the objects of the present disclosure as mentioned above, additional objects and features of the present disclosure will be clearly understood by those skilled in the art from the following description of the present disclosure.

In one embodiment, an organic light emitting display apparatus comprises: a subpixel including a light emission area, the subpixel configured to emit light in the light emission area; a planarization layer that overlaps the light emission area, the planarization layer including a plurality of light extraction patterns having a plurality of convex portions and a plurality of concave portions; a light control pattern alternately disposed in the plurality of concave portions of the plurality of light extraction patterns; and a light emitting element disposed on the plurality of light extraction patterns and the light control pattern.

In one embodiment, a display apparatus comprises: a substrate including a light emitting area; a subpixel on the substrate, the subpixel including a light emitting element configured to emit light in the light emission area toward the substrate; a planarization layer in the light emitting area, the planarization layer including a plurality of concave portions that extend toward the substrate and overlap the light emitting element; and a light control pattern disposed in a first plurality of concave portions from the plurality of concave portions but is not disposed in a second plurality of concave portions from the plurality of concave portions.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
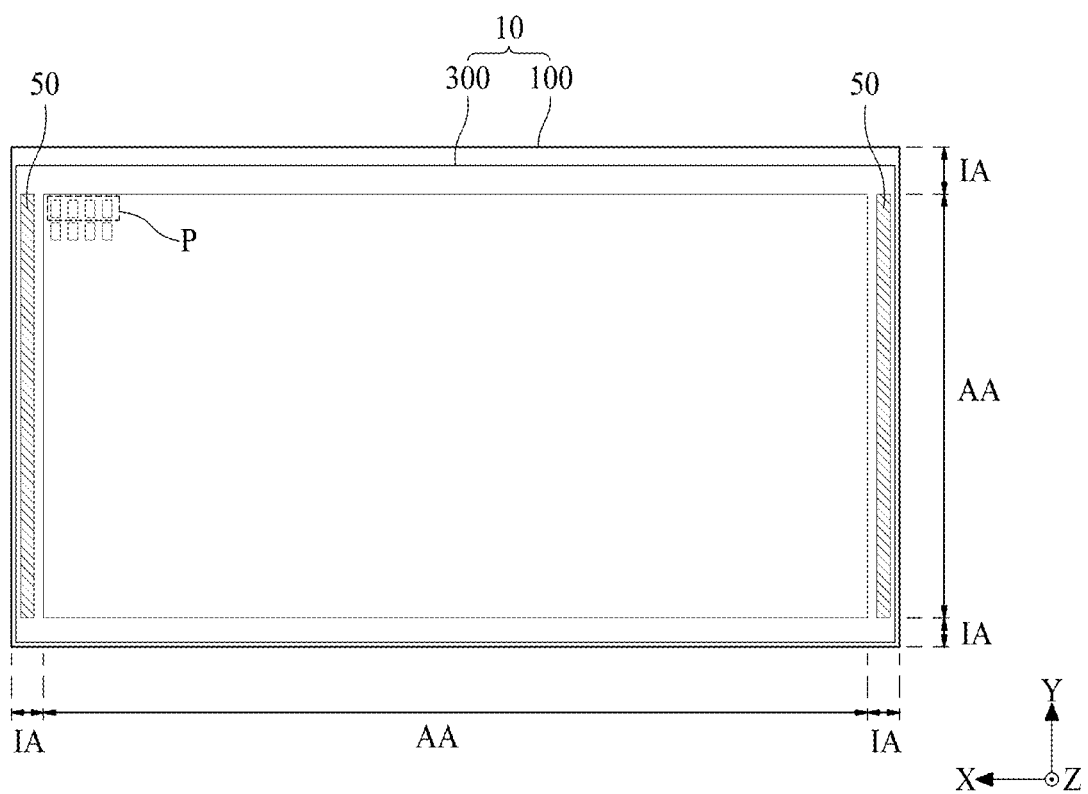
FIG. 1 is a view illustrating an organic light emitting display apparatus according to one embodiment of the present disclosure.

Hereinafter, the embodiments of the present disclosure will be described in detail with reference to the accompanying drawings. The following embodiments are provided as an example so that spirits of the present disclosure may be sufficiently transferred to those skilled in the art. Therefore, the present disclosure is not limited to the embodiments described below and may be embodied in other forms. In the drawings, a size and thickness of the apparatus may be exaggerated for convenience. Wherever possible, the same reference numbers will be used throughout the drawings to refer to the same or like parts. Also, in the following description, when the detailed description of the relevant known art is determined to unnecessarily obscure the subject matter of the present disclosure, the detailed description will be omitted.

In the case in which "comprise," "have," and "include" described in the present disclosure are used, another portion may also be present unless "only" is used. The terms in a singular form may include plural forms unless noted to the contrary.

In describing a position relationship, for example, when the position relationship is described as 'upon~%', 'above', 'below~%', and 'next to~', one or more portions may be arranged between two other portions unless 'just' or 'direct' is used. Spatially relative terms such as "below", "beneath", "lower", "above", and "upper" may be used herein to easily describe a relationship of one element or elements to another element or elements as illustrated in the figures. It will be understood that these terms are intended to encompass different orientations of the apparatus in addition to the orientation depicted in the figures. For example, if the apparatus illustrated in the figure is reversed, the apparatus described to be arranged "below", or "beneath" another apparatus may be arranged "above" another apparatus. Therefore, an exemplary term "below or beneath" may include "below or beneath" and "above" orientations. Likewise, an exemplary term "above" or "on" may include "above" and "below or beneath" orientations.

In describing elements of the present disclosure, the terms "first", "second", "A", "B", "(a)", "(b)", etc. may be used. These terms are intended to identify the corresponding elements from the other elements, and basis, order, or number of the corresponding elements are not limited by these terms.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, an organic light emitting display apparatus according to the present disclosure will be described in detail with reference to the accompanying drawings and embodiments. FIG. 1 is a view illustrating an organic light emitting display apparatus according to one embodiment of the present disclosure.

Referring to FIG. 1, the organic light emitting display apparatus according to one embodiment of the present disclosure may include a display panel 10 that includes a substrate 100 (e.g., a first substrate) and an opposite substrate 300 (e.g., a second substrate), which are bonded to each other.

The substrate 100 includes a thin film transistor, and may be a transparent glass substrate or a transparent plastic substrate. The substrate 100 may include a display area AA and a non-display area IA.

The display area AA may be an area where an image is displayed, and may be a pixel array area, an active area, a pixel array unit, a display unit or a screen. The display area AA may include a plurality of pixels P. The plurality of pixels P may be a unit area in which light is actually emitted.

The non-display area IA may be an area where an image is not displayed, and may be a peripheral circuit area, a signal supply area, a non-active area or a bezel area. The non-display area IA may be configured to surround the display area AA. The display panel 10 or the substrate 100 may further include a peripheral circuit unit 50 disposed in the non-display area IA.

The opposite substrate 300 may be attached to the substrate 100 by an adhesive member (or transparent adhesive), or may be disposed on the substrate 100 in a manner that an organic or inorganic material is stacked on the substrate 100. The opposite substrate 300 may be an upper substrate, a second substrate or an encapsulation substrate, and may correspond to an element for encapsulating the substrate 100.

Figure 2:
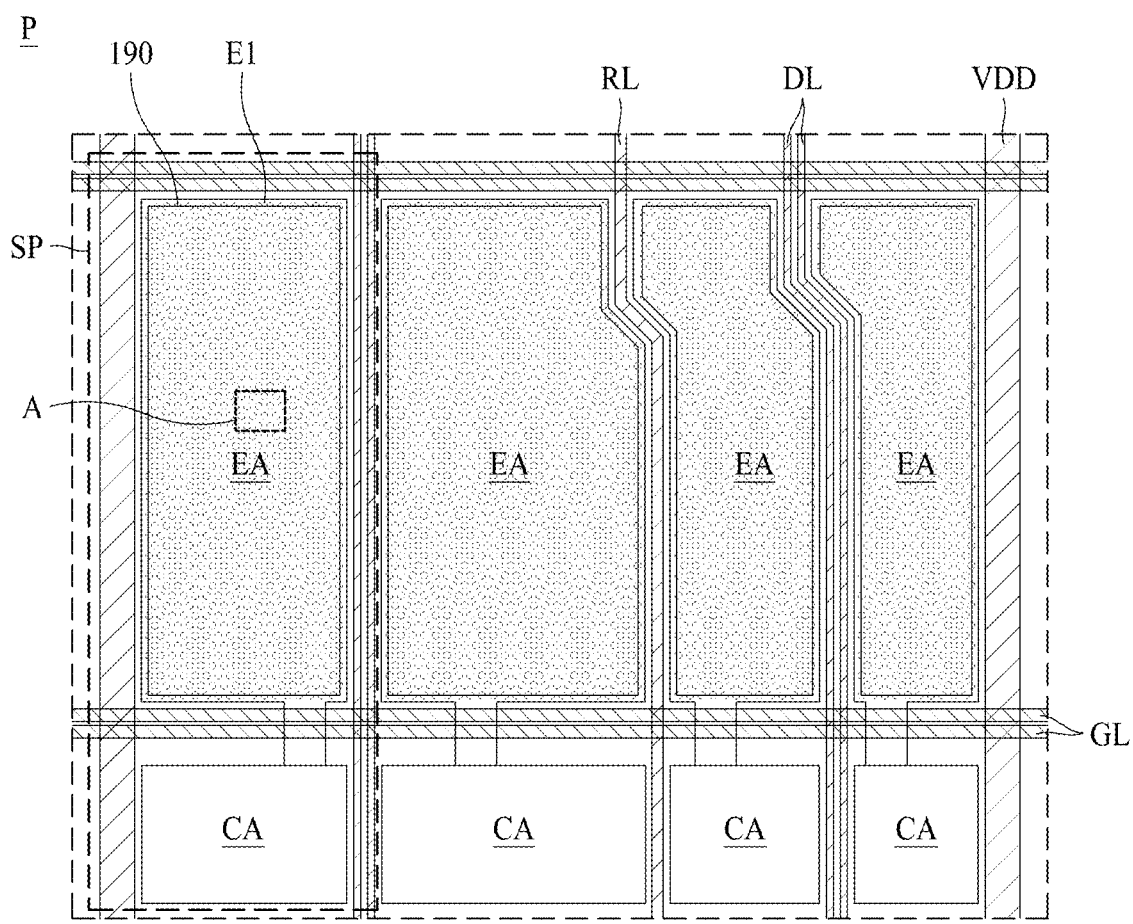
FIG. 2 is a view illustrating a plane structure of a unit pixel according to one embodiment of the present disclosure.
Figure 3:
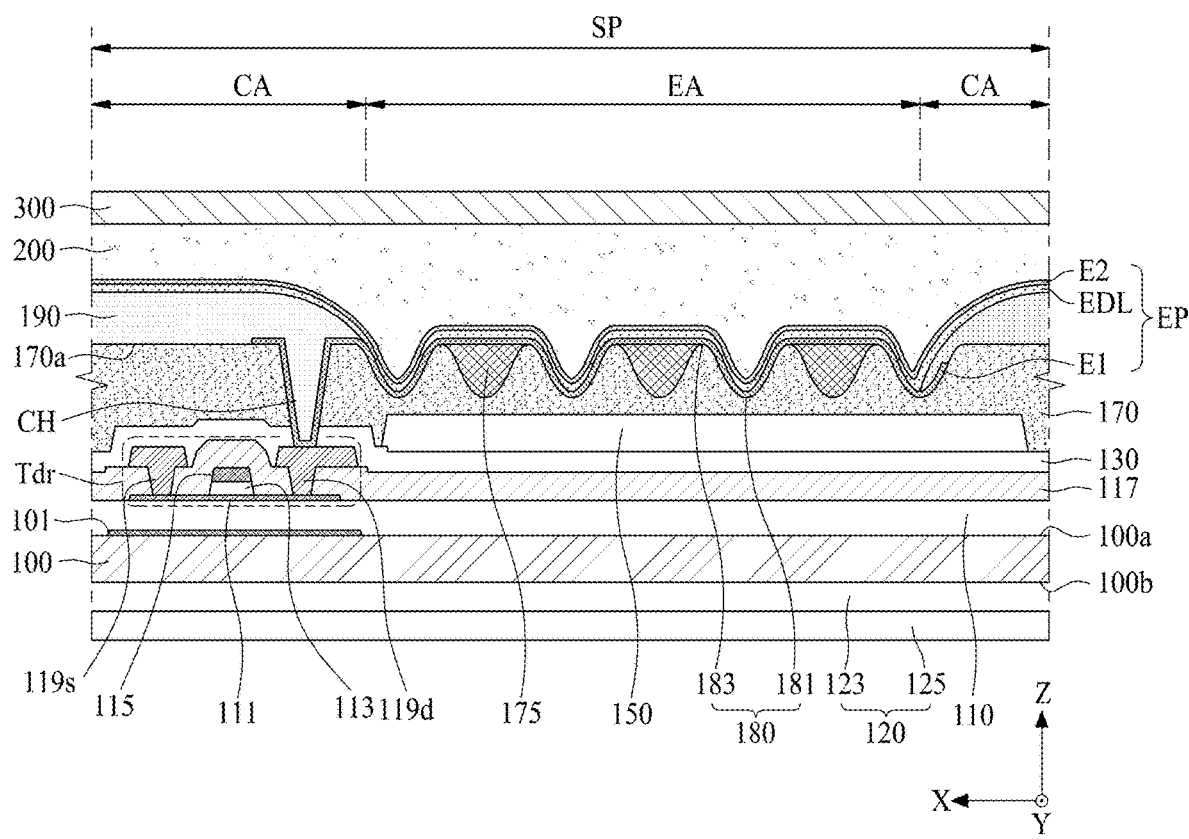
FIG. 3 is a cross-sectional view illustrating a sectional structure of one subpixel of FIG. 2 according to one embodiment of the present disclosure.
Figure 4:
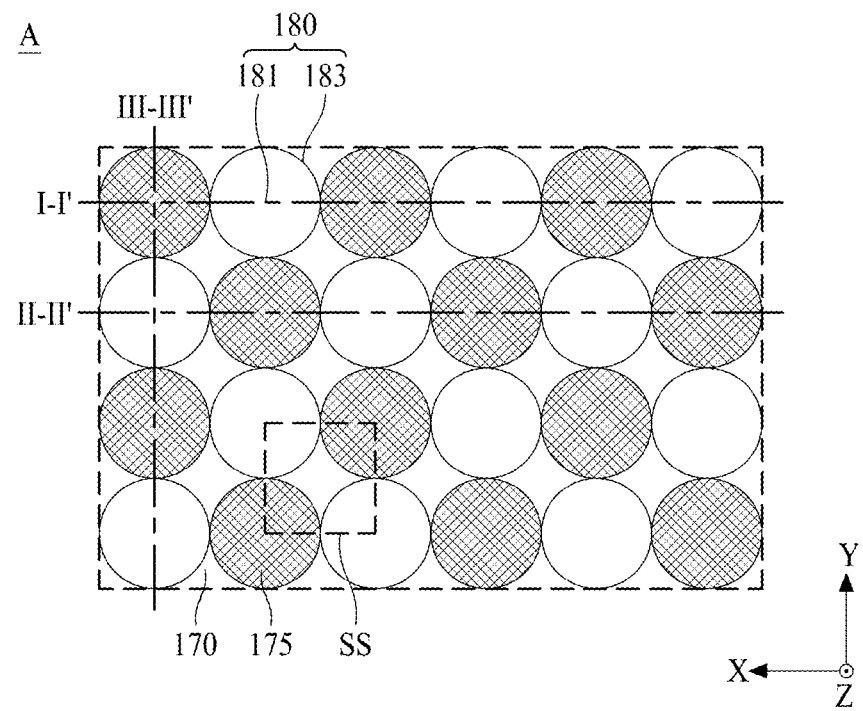
FIG. 4 is an enlarged plan view illustrating a portion A of FIG. 2 according to one embodiment of the present disclosure.

FIG. 2 is a view illustrating a plane structure of a unit pixel according to one embodiment of the present disclosure, FIG. 3 is a cross-sectional view illustrating a sectional structure of one subpixel SP of FIG. 2 according to one embodiment of the present disclosure, and FIG. 4 is an enlarged plan view illustrating a portion A of FIG. 2 according to one embodiment of the present disclosure.

Referring to FIGS. 2 to 4, the organic light emitting display apparatus according to one embodiment of the present disclosure may include a plurality of unit pixels P, each of which is configured by a plurality of subpixels SP in the display area AA.

One subpixel SP may include a pixel area and a circuit area CA. The pixel area may include a light emission area EA. The circuit area CA may be spatially separated from the light emission area EA in the subpixel SP. The light emission area EA is an area defined by the pixel area that is opened by a bank 190 in the subpixel SP, and the circuit area CA may be a non-light emission area or a non-opening area.

One unit pixel P may include four subpixels SP in one embodiment. The subpixels SP may include a red pixel, a white pixel, a blue pixel, and a green pixel. A gate line GL is disposed to be extended across the light emission area EA and the circuit area CA of the subpixel SP between the light emission area EA and the circuit area CA. A plurality of data lines DL or reference lines RL are disposed to be extended across adjacent light emission areas EA or adjacent circuit areas CA between the adjacent light emission areas EA or between the adjacent circuit areas CA. A power line VDD extended in a direction parallel with the data line DL is disposed in one unit pixel P. The reference line RL may be used as a sensing line for sensing a characteristic change of a driving thin film transistor disposed in the circuit area CA and/or a characteristic change of a light emitting element layer from the outside during a sensing driving mode of the unit pixel P.

As shown in FIG. 3, the organic light emitting display apparatus according to the present disclosure may include a substrate 100, a planarization layer 170 having a light extraction pattern 180, a light control pattern 175, a light emitting element EP, and an optical film 120. The light emitting element EP is driven by a driving thin film transistor Tdr disposed between the substrate 100 and the planarization layer 170.

A buffer layer 110, the driving thin film transistor Tdr, a protective layer 130, the planarization layer 170 and the light emitting element EP may be sequentially stacked on a first surface 100a of the substrate 100. The optical film 120 may be disposed on a second surface 100b of the substrate 100. An image is displayed in a direction of the second surface 100b of the substrate 100 to which the optical film 120 is attached. For example, the substrate 100 may be disposed in a direction in which light of the light emitting element EP is emitted, and the optical film 120 may be attached to the substrate in the direction in which the light is emitted.

The optical film 120 includes a phase film 123 and a polarizing film 125, and the phase film 123 is disposed between the substrate 100 and the polarizing film 125. The optical film 120 may be disposed to be attached to the second surface 100b of the substrate 100 by an adhesive material (not shown).

The polarizing film 125 may be formed in a shape in which a plurality of layers are stacked and attached to the phase film 123, and may change a direction, through which the light passes, to one direction. For example, the polarizing film 125 may change a phase by 90°. The phase film 123 may change the phase of the light that passes, by 45°.

The buffer layer 110 disposed on the first surface 100a of the substrate 100 may be disposed on the entire first surface 100a of the substrate 100. The buffer layer 110 may serve to prevent or at least reduce a material contained in the substrate 100 from being diffused into a thin film transistor layer during a high temperature process of a manufacturing process of the thin film transistor or serve to prevent or at least reduce external water or moisture from being permeated into the light emitting element. Optionally, the buffer layer 110 may be comprised of a plurality of layers or omitted, as the case may be.

The driving thin film transistor Tdr is disposed in the circuit area CA, and the driving thin film transistor Tdr may include an active layer 111, a gate insulating layer 113, a gate electrode 115, an interlayer insulating layer 117, a drain electrode 119d and a source electrode 119s. The drain electrode 119d and the source electrode 119s may be defined to be reversed depending on the type of the driving thin film transistor Tdr.

The active layer 111 constituting the driving thin film transistor Tdr may be made of a semiconductor material based on any one of amorphous silicon, polycrystalline silicon, oxide and an organic material, for example.

The gate insulating layer 113 may be disposed on a channel area of the active layer 111 in an island shape, or may be fully disposed on the substrate 100 or the buffer layer 110, which includes the active layer 111.

The interlayer insulating layer 117 may be disposed on the gate electrode 115 and the active layer 111. The interlayer insulating layer 117 may be fully disposed in the circuit area CA and the light emission area EA. The interlayer insulating layer 117 may be made of an inorganic material, an organic material or a combination thereof.

In the circuit area CA, a switching thin film transistor and a capacitor may be further disposed together with the driving thin film transistor Tdr. A light shielding layer 101 may be further disposed below the active layer 111 of at least one of the driving thin film transistor Tdr or the switching thin film transistor on the substrate 100.

The protective layer 130 may be provided on the substrate 100 to cover the driving thin film transistor Tdr. The protective layer 130 covers the drain electrode 119d and the source electrode 119s of the driving thin film transistor Tdr and the interlayer insulating layer 117. The protective layer 130 may be fully disposed in the circuit area CA and the light emission area EA. The protective layer 130 may be expressed as terms of a passivation layer.

The organic light emitting display apparatus according to the present disclosure may further include a wavelength conversion layer 150 on the first surface 100a of the substrate 100.

The wavelength conversion layer 150 may be disposed between the substrate 100 and the planarization layer 170 to overlap the at least one light emission area EA. The wavelength conversion layer 150 may be disposed between the protective layer 130 and the planarization layer 170 to overlap the light emission area EA. The wavelength conversion layer 150 according to another example may be disposed between the interlayer insulating layer 117 and the protective layer 130 or between the substrate 100 and the interlayer insulating layer 117 to overlap the light emission area EA.

The wavelength conversion layer 150 may have a size wider than that of the light emission area EA. Since the wavelength conversion layer 150 is wider than the light emission area EA, the wavelength conversion layer 150 may have a size wider than that of the light extraction pattern 180 of the planarization layer 170. When the wavelength conversion layer 150 has a size wider than that of the light extraction pattern 180, leakage of internal light to an adjacent subpixel SP may be reduced.

The wavelength conversion layer 150 includes a color filter that transmits a specific wavelength of light of a color set to a subpixel SP among light emitted from the light emitting element EP toward the substrate 100. The wavelength conversion layer 150 may transmit a red, green, or blue wavelength. In the organic light emitting display apparatus according to the present disclosure, when one unit pixel P is comprised of first to fourth subpixels SP adjacent to one another, the wavelength conversion layer 150 provided in the first subpixel may include a red color filter, the wavelength conversion layer 150 provided in the second subpixel may include a green color filter, and the wavelength conversion layer 150 provided in the third subpixel may include a blue color filter. The fourth subpixel may emit white light because the wavelength conversion layer 150 is not disposed in the fourth subpixel.

The planarization layer 170 may be provided on the substrate 100 to cover the protective layer 130. When the protective layer 130 is omitted, the planarization layer 170 may be provided on the substrate 100 to cover the driving thin film transistor Tdr, the wavelength conversion layer 150 and various lines. The planarization layer 170 may be fully disposed in the circuit area CA and the light emission area EA. In addition, the planarization layer 170 may be disposed on the entire display area AA shown in FIG. 1. The planarization layer 170 may be disposed to reach the non-display area with a size relatively wider than that of the display area AA.

The planarization layer 170 may be disposed to be relatively thick, thereby providing a flat surface on the display area AA. The planarization layer 170 may be made of an organic material such as photo acryl, benzocyclobutene, polyimide and fluorine resin.

The planarization layer 170 may include a light extraction pattern 180 disposed in the pixel area PA. The light extraction pattern 180 may be disposed on an upper surface 170a of the planarization layer 170 to overlap the light emission area EA of the pixel area. The light extraction pattern 180 is formed on the planarization layer 170 of the light emission area EA to have a curved (or uneven) shape, thereby changing a moving path of the light emitted from the light emitting element EP to increase light extraction efficiency.

The light extraction pattern 180 includes a plurality of concave portions 181 and a plurality of convex portions 183 between the plurality of concave portions 181, and the convex portions 183 and the concave portions 181 are alternately disposed and extend from each other. The plurality of concave portions 181 of the light extraction pattern 180 are concave based on the upper surface 170a of the planarization layer 170, but a plurality of convex surfaces may be disposed to be connected in the form of a lens in a direction toward the substrate 100. The plurality of concave portions 181 may have the same depth based on the upper surface 170a of the planarization layer 170, but some of the plurality of concave portions 181 may have different depths. As shown in FIG. 3, the concave portions 181 are disposed through a thickness of the planarization layer 170, but not through the entire thickness of the planarization layer 170.

The light extraction pattern 180 may have a size wider than that of the light emission area EA of the subpixel SP. When the light extraction pattern 180 has a size wider than that of the light emission area EA, light efficiency in the light emission area EA may be further increased. The light extraction pattern 180 may be an uneven pattern, a micro lens or a light scattering pattern.

Figure 5A:
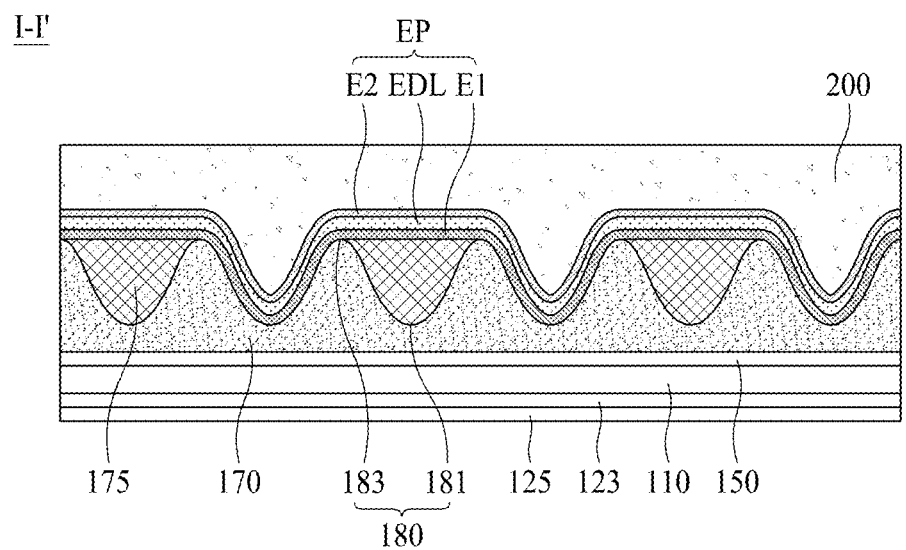
FIG. 5A is a cross-sectional view taken along line I-I' of FIG. 4.
Figure 5B:
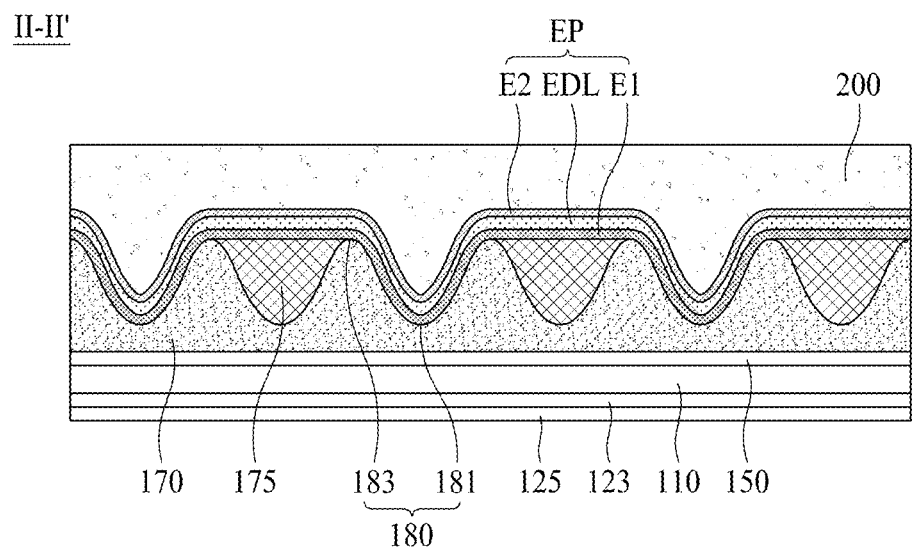
FIG. 5B is a cross-sectional view taken along line II-II' of FIG. 4.
Figure 5C:
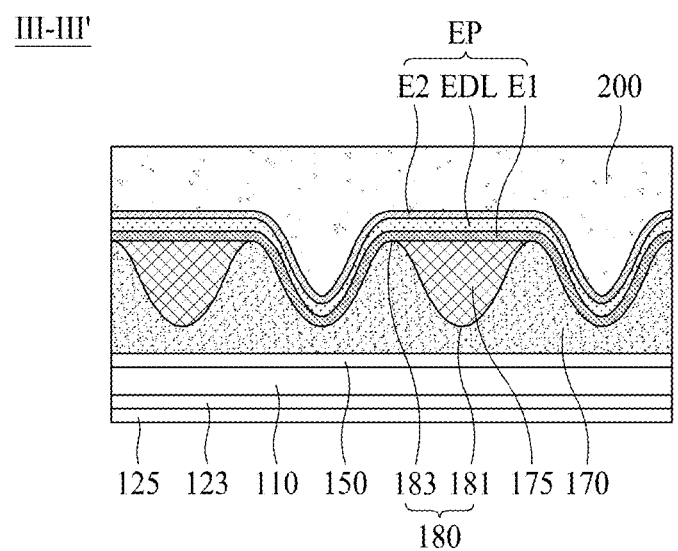
FIG. 5C is a cross-sectional view taken along line III-III' of FIG. 4 according to one embodiment of the present disclosure.

Referring to FIGS. 4 to 5C, each of the plurality of concave portions 181 of the organic light emitting display apparatus according to one embodiment (Embodiment 1) may be disposed at every interval of the light extraction pattern 180 in parallel along a first direction X, and may be disposed at every interval of the light extraction pattern 180 along a second direction Y. The light extraction pattern 180 may be disposed at a predetermined interval. Each of the plurality of concave portions 181 may be disposed in a grid shape having a predetermined interval. The adjacent concave portions 181 disposed along the first direction X may be connected to each other in a straight line, and the adjacent concave portions 181 disposed along the second direction Y may be connected to each other in a straight line.

A central portion of each of the four adjacent concave portions 181 may be aligned to form a square shape SS. Also, each of the plurality of concave portions 181 may be surrounded by eight concave portions 181 disposed therearound, and at this time, a shape that the central portions of the four adjacent concave portions 181 are sequentially connected may form a planar square shape. Although the concave portion 181 shown in the present disclosure has a planar outer appearance of a circle structure, an outer periphery of each of the plurality of concave portions 181 may be disposed or arranged in a honeycomb structure or a circle structure.

Pitches (or intervals) between the concave portions 181 respectively disposed in the plurality of subpixels SP may be the same as or different from each other. In this case, the pitch between the concave portions 181 may be a distance (or interval) between central portions of two adjacent concave portions 181.

The convex portion 183 may be provided in the planarization layer 170, which overlaps the light emission area EA, to have a shape that may maximize (e.g., increase) external extraction efficiency of light generated in the subpixel SP based on an effective light emission area of the light emitting element EP.

The convex portion 183 may change a moving path of the light emitted from the light emitting element EP toward a light emitting surface. According to one embodiment of the present disclosure, the convex portion 183 changes the moving path of the light emitted from the light emitting element EP toward the substrate 100 to prevent or at least reduce the light emitted from the light emitting element EP from being trapped therein, thereby emitting the light to the outside and thus increasing light extraction efficiency.

The convex portions 183 may be implemented to surround each of the plurality of concave portions 181. The plurality of convex portions 183 surrounding one concave portion 181 may be connected to have a honeycomb shape.

The convex portions 183 may be formed to be connected to each other between the plurality of concave portions 181. An upper portion of the convex portion 183 may include a dome or bell structure having a convex cross-sectional shape as shown in FIGS. 5A to 5C, but is not limited thereto. An inclined portion between the convex portion 183 and the concave portion 181 may have a curved shape. The inclined portion between the convex portion 183 and the concave portion 181 may have a tangent slope that is gradually increased from the bottom of the concave portion 181 to the upper portion of the convex portion 183 and gradually reduced.

As shown in FIG. 3, the light control pattern 175 is disposed on the light extraction pattern 180 of the planarization layer 170, and is disposed in the concave portion 181 of the light extraction pattern 180. The light control pattern 175 is disposed in a plural number to alternately planarize an upper surface of the concave portion 181 by alternately filling the concave portions 181 of the light extraction pattern 180. Thus, a subset of the concave portions 181 are filled with the light control pattern 175. The light control pattern 175 is made of an organic material having a refractive index higher than that of the planarization layer 170. The refractive index of the light control pattern 175 may be 1.57 or more. The light control pattern 175 may be made of a transparent material, and may have transmittance of 90% or more. The light control pattern 175 may include particles. The light control pattern 175 may control straight directionality of light by refracting internal light.

As shown in FIG. 4, the light control patterns 175 may be alternately disposed in adjacent concave portions 181 of the light extraction pattern 180 so that the light control patterns 175 may be spaced apart from each other in at least one direction. For example, two light control patterns 175 are spaced apart from each other with the convex portion 183, the concave portion 181 and the convex portion 183 of the light extraction pattern 180, which are interposed therebetween, in at least one direction.

The central portions of four adjacent concave portions 181 may be connected (e.g., aligned) to each other to form a square shape SS as shown in FIG. 4, and both corners connected by a line of the square shape SS have their respective structures different from each other, and both corners that are not connected to each other by the line have the same symmetrical structure.

The light control pattern 175 is disposed in one of the concave portions 181 of both corners, which are connected in a straight line in the square shape SS and face each other, but is not disposed in another concave portion 181. The light control pattern 175 is disposed on both concave portions 181 of both corners facing each other based on a diagonal direction in the square shape SS, or the light control pattern 175 is not disposed on both concave portions 181 of both corners facing each other based on a diagonal direction opposite to the diagonal direction. In this case, the light control pattern 175 may be alternately disposed in the concave portion 181 of the light extraction pattern 180.

As shown in FIGS. 5A to 5C, the light control pattern 175 fills the concave portion 181 between the two convex portions 183 of the light extraction pattern 180 in the first direction X to planarize the concave portion 181, but is not disposed in the concave portion 181 immediately adjacent to the concave portion 181 filled by the light control pattern 175. For example, the light control pattern 175 disposed in one row in the first direction X is not overlapped with the light control pattern 175 disposed in next row or adjacent row in the first direction X. The concave portion 181 of one row filled with the light control pattern 175 in the first direction X is disposed to overlap the concave portion 181 of next row or adjacent row that is not filled with the light control pattern 175 in the first direction X.

As shown in FIGS. 5A to 5C, the light control pattern 175 fills the concave portion 181 between the two convex portions 183 of the light extraction pattern 180 in the second direction Y to planarize the concave portion 181, but is not disposed in the concave portion 181 immediately adjacent to the concave portion 181 filled by the light control pattern. For example, the light control pattern 175 disposed in one column in the second direction Y does not overlap (e.g., non-overlapping) the light control pattern 175 disposed in next column or adjacent column in the second direction Y. The concave portion 181 of one column filled with the light control pattern 175 in the second direction Y is disposed to overlap the concave portion 181 of next column or adjacent column that is not filled with the light control pattern 175 in the second direction Y.

When the concave portions 181 of the four adjacent light extraction patterns 180 are symmetrical to each other based on the diagonal direction, the light control pattern 175 is disposed in the concave portions 181 in one diagonal direction, and is not disposed in the concave portions 181 in the other diagonal direction. In this case, the light control pattern 175 may be alternately disposed in the concave portion 181 of the light extraction pattern 180.

Figure 6:
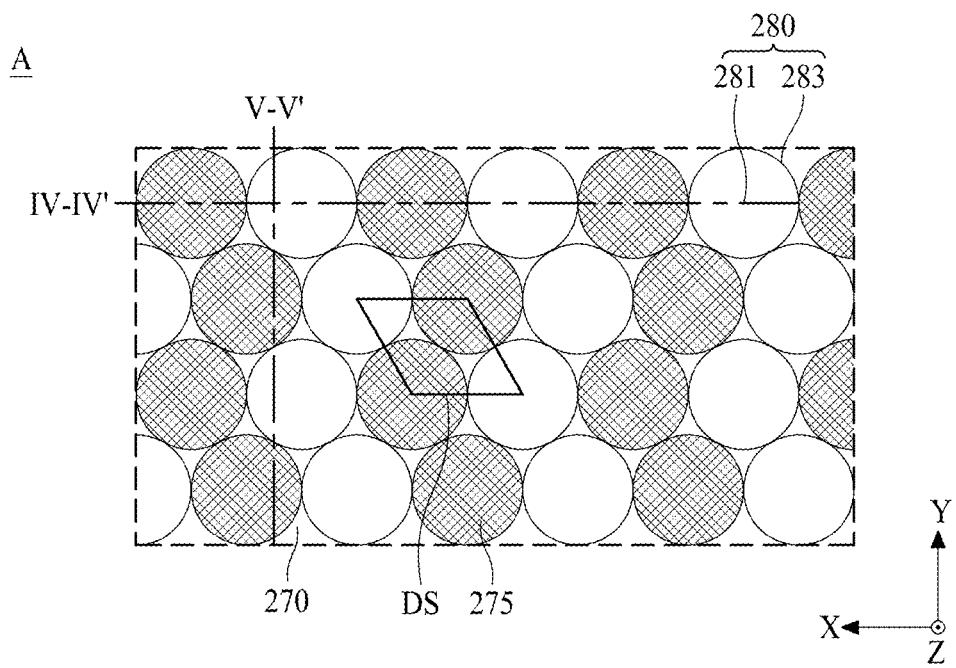
FIG. 6 is an enlarged plan view illustrating another example of a portion A of FIG. 2 according to one embodiment of the present disclosure.
Figure 7A:
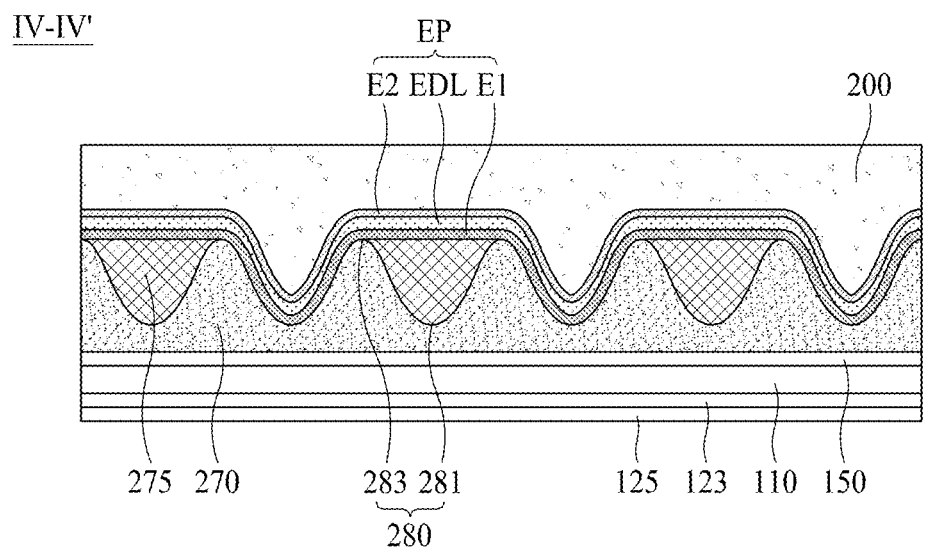
FIG. 7A is a cross-sectional view taken along line IV-IV' of FIG. 6.
Figure 7B:
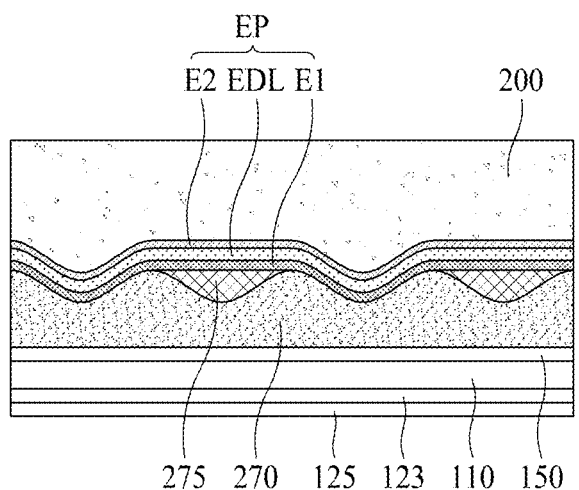
FIG. 7B is a cross-sectional view taken along line V-V' of FIG. 6 according to one embodiment of the present disclosure.

FIG. 6 is a plan view illustrating another embodiment. Referring to FIGS. 6, 7A, and 7B, a planarization layer 270 of the organic light emitting display apparatus according to another embodiment (Embodiment 2) of the present disclosure may include a light extraction pattern 280 disposed in the pixel area in accordance with another embodiment of the present disclosure. The light extraction pattern 280 is disposed to overlap the light emission area EA of the pixel area to change the moving path of the light emitted from the light emitting element EP, thereby increasing light extraction efficiency.

The light extraction pattern 280 includes a plurality of concave portions 281 and a plurality of convex portions 283 between the plurality of concave portions 281. The plurality of convex portions 283 and the plurality of concave portions 281 are alternately disposed to be connected to each other. The plurality of concave portions 281 may have the same depth based on the upper surface of the planarization layer 270, but some of the plurality of concave portions 281 may have different depths.

The light extraction pattern 280 may have a size wider than that of the light emission area EA of the subpixel SP. When the light extraction pattern 280 has a size wider than that of the light emission area EA, light efficiency in the light emission area EA may be further increased. The light extraction pattern 280 may be an uneven pattern, a micro lens or a light scattering pattern.

The plurality of concave portions 281 may be spaced apart from each other in parallel along the first direction X to have a predetermined gap therebetween, and may be disposed at every interval of the light extraction pattern 280 along the second direction Y. The light extraction pattern 280 may be disposed at a predetermined interval. Each of the plurality of concave portions 281 may be disposed in a rhombus or diamond shape (DS), which has a predetermined interval. The adjacent concave portions 281 disposed along the second direction Y may be connected to each other in a zigzag shape, and the adjacent concave portions 281 disposed along the first direction X may be connected to each other in a straight line.

A central portion of each of four adjacent concave portions 281 may form a square shape or a rhombus or diamond shape DS. Also, each of the plurality of concave portions 281 may be surrounded by the concave portion 281 of six light extraction patterns 280 disposed therearound. At this time, a central portion of each of six concave portions 281 surrounding one concave portion 281 may have a planar hexagonal shape. Although the light extraction pattern 280 of an external appearance of the concave portion 281 shown in the present disclosure is shown in a circle structure, the outer periphery of the light extraction pattern 280 of each of the plurality of concave portions 281 may be disposed or arranged in a honeycomb structure or a circle structure.

Pitches (or intervals) between the concave portions 281 respectively disposed in the plurality of subpixels SP may be the same as or different from each other. In this case, the pitch between the concave portions 281 may be a distance (or interval) between central portions of two adjacent concave portions 281.

The convex portion 283 may be provided in the planarization layer 270, which overlaps the light emission area EA, to have a shape that may maximize external extraction efficiency of light generated in the subpixel SP based on an effective light emission area of the light emitting element EP.

The convex portion 283 may change a moving path of the light emitted from the light emitting element EP toward a light emitting surface. According to one embodiment of the present disclosure, the convex portion 283 changes the moving path of the light emitted from the light emitting element EP toward the substrate 100 to prevent the light emitted from the light emitting element EP from being trapped therein, thereby emitting the light to the outside and thus increasing light extraction efficiency.

The plurality of convex portions 283 may be implemented to surround each of the plurality of concave portions 281. The plurality of convex portions 183 surrounding one concave portion 281 may be connected to have a honeycomb shape.

The convex portions 283 may be formed to be connected to each other between the plurality of concave portions 281. An upper portion of the convex portion 283 may include a dome or bell structure having a convex cross-sectional shape as shown in FIGS. 7A and 7B, but is not limited thereto. An inclined portion between the convex portion 283 and the concave portion 281 may have a curved shape. The inclined portion between the convex portion 283 and the concave portion 281 may have a tangent slope that is gradually increased from the bottom of the concave portion 281 to the upper portion of the convex portion 283 and gradually reduced.

The light control pattern 275 is disposed on the light extraction pattern 280 of the planarization layer 270, and is disposed in the concave portion 281 of the light extraction pattern 280. The light control pattern 275 is disposed in a plural number to alternately planarize the concave portion 281 by alternately filling the concave portion 281 of the light extraction pattern 280. The light control pattern 275 is made of an organic material having a refractive index higher than that of the planarization layer 270. The refractive index of the light control pattern 275 may be 1.57 or more. The light control pattern 275 may be made of a transparent material, and may have transmittance of 90% or more. The light control pattern 275 may include particles. The light control pattern 275 may control straight directionality of light by refracting internal light.

As shown in FIG. 6, the light control patterns 275 are alternately disposed in adjacent concave portions 281 of the light extraction pattern 280, which are adjacent to each other in at least one direction, so that the light control patterns 275 are spaced apart from each other in at least one direction. For example, two light control patterns 275 are spaced apart from each other with the convex portion 283, the concave portion 281 and the convex portion 283 of the light extraction pattern 280, which are interposed therebetween, in at least one direction.

The central portions of four adjacent concave portions 281 may be connected to each other to form a rhombus shape DS or diamond shape, and both corners connected by a line of the rhombus shape DS have their respective structures different from each other, and both corners that are not connected to each other by the line have the same symmetrical structure.

The light control pattern 275 is disposed in one of the concave portions 281 of both corners, which are connected in a line in the rhombus shape DS and face each other, but is not disposed in the other concave portion 281. The light control pattern 275 is disposed on the concave portions 281 of both corners facing each other based on a diagonal direction in the rhombus shape DS, and the light control pattern 275 is not disposed on the concave portions 281 of both corners facing each other based on a diagonal direction opposite to the diagonal direction. In this case, the light control pattern 275 may be alternately disposed in the concave portion 281 of the light extraction pattern 280.

The light control pattern 275 fills the concave portion 281 between the two convex portions 283 of the light extraction pattern 280 in the first direction X to planarize the concave portion 281, but is not disposed in the concave portion 281 immediately adjacent to the concave portion 281 filled by the light control pattern 275. At this time, as shown in FIG. 6, for example, the light control pattern 275 disposed in one row in the first direction X is at least partially overlapped with the light control pattern 275 disposed in next row or adjacent row in the first direction X. The concave portion 281 of one row filled with the light control pattern 275 in the first direction X is disposed to at least partially overlap the concave portion 281 of next row or adjacent row that is not filled with the light control pattern 275 in the first direction X.

As shown in FIG. 7B, the light control pattern 275 fills the concave portion 281 between the two convex portions 283 of the light extraction pattern 280 in the second direction Y to planarize the concave portion 281, but is not disposed in the concave portion 281 immediately adjacent to the concave portion 281 filled by the light control pattern 275. At this time, as shown in FIG. 6, for example, at least a portion of the light control pattern 275 disposed in one column in the second direction Y does not overlap (e.g., is non-overlapping) the light control pattern 275 disposed in next column or adjacent column in the second direction Y. At least a portion of the concave portion 281 of one column filled with the light control pattern 275 in the second direction Y is disposed to overlap the concave portion 281 of next column or adjacent column that is not filled with the light control pattern 275 in the second direction Y.

When the concave portions 281 of the four adjacent light extraction patterns 280 are symmetrical to each other based on the diagonal direction, the light control pattern 275 is disposed in the concave portions 281 in one diagonal direction, and is not disposed in the concave portions 281 in the other diagonal direction. In this case, the light control pattern 275 may be alternately disposed in the concave portion 281 of the light extraction pattern 280.

As shown in FIG. 3, the light emitting element EP may be disposed on the light extraction pattern 180 of the light emission area EA and emit light toward the substrate 100 in accordance with a bottom emission method. The light emitting element EP is disposed along a surface shape (or morphology) of the light extraction pattern 180 and the light control pattern 175, so that the light emitting element EP is disposed on the inclined portion of the light extraction pattern 180 while having a concave shape in the concave portion 181 of the light extraction pattern 180 in which the light control pattern 175 is not disposed, and has a cross-sectional structure of a flat upper surface in the concave portion 181 of the light extraction pattern 180 in which the light control pattern 175 is disposed. The light emitting element EP alternatively has a concave shape or a curved shape and a flat shape in accordance with the arrangement structure of the light control pattern 175.

The light emitting element EP according to one example may include a first electrode E1, a light emitting element layer EDL, and a second electrode E2. The light emitting element EP is equally applied to the embodiment of FIGS. 6, 7A, and 7b, which illustrate another embodiment, and thus its detailed description will be omitted. The light emitting element EP will be replaced with the following description.

The first electrode E1 may be disposed on the planarization layer 170 on the pixel area and thus be electrically connected to the drain electrode 119d of the driving thin film transistor Tdr. One end of the first electrode E1 adjacent to the circuit area CA may be electrically connected to the drain electrode 119d of the driving thin film transistor Tdr through an electrode contact hole CH provided in the planarization layer 170 and the protective layer 130.

Since the first electrode E1 is directly in contact with the light extraction pattern 180 and the light control pattern 175, the first electrode E1 has a shape that follows the shape of the light extraction pattern 180 and the light control pattern 175. That is, the surface shape of the first electrode E1 substantially matches the shape of the light extraction pattern 180 and the light control pattern 175. Since the first electrode E1 is disposed (or deposited) on the planarization layer 170 and the light control pattern 175 to have a thickness that is relatively thin, the first electrode E1 may have a morphology (or second morphology) that follows the morphology (or first morphology) of the light control pattern 175 and the light extraction pattern 180 including the convex portion 183 and the plurality of concave portions 181.

The first electrode E1 is disposed in a shape that follows the surface shape (or morphology) of the light extraction pattern 180 and the light control pattern 175 by a deposition process of a transparent conductive material, so that the first electrode E1 follows a concave shape in the concave portion 181 of the light extraction pattern 180 in which the light control pattern 175 is not disposed, and has a flat cross-sectional structure in the concave portion 181 of the light extraction pattern 180 in which the light control pattern 175 is disposed. The first electrode E1 alternately has a concave shape and a flat shape in accordance with the arrangement structure of the light control pattern 175. That is, the first electrode includes a plurality of portions that are disposed within the concave portions 181/281 that lack the light control pattern 175, and a plurality of portions that are not disposed within the concave portions 181/281 that are filled with the light control pattern 175.

The light emitting element layer EDL may be disposed on the first electrode E1 and thus be directly in contact with the first electrode E1. The light emitting element layer EDL may be disposed (or deposited) on the first electrode E1 to be relatively thicker than the first electrode E1 so that the light emitting element layer EDL may have a morphology that is different from that of each of the convex portions 183 and the plurality of concave portions 181, and may have a morphology that follows that of the first electrode E1.

The light emitting element layer EDL may be disposed by a deposition process to follow the surface shape (or morphology) of the first electrode E1, so that the light emitting element layer EDL follows a concave shape in the concave portion 181 of the light extraction pattern 180 in which the light control pattern 175 is not disposed, and has a flat shaped cross-sectional structure in the concave portion 181 of the light extraction pattern 180 in which the light control pattern 175 is disposed. That is, the surface shape of the light emitting element layer EDL substantially matches the shape of the light extraction pattern 180 and the light control pattern 175. The light emitting element layer EDL alternately has a concave shape and a flat shape in accordance with the arrangement structure of the light control pattern 175. The light emitting element layer EDL may be disposed by a deposition process to have a non-conformal shape that does not follow the surface shape (or morphology) of the first electrode E1, thereby having a cross-sectional structure different from that of the first electrode E1. That is, the light emitting element layer EDL includes a plurality of portions that are disposed within the concave portions 181/281 that lack the light control pattern 175, and a plurality of portions that are not disposed within the concave portions 181/281 that are filled with the light control pattern 175.

The light emitting element layer EDL may be disposed to have a thickness that is gradually thick toward the bottom surface of the concave portion 181 in which the light control pattern 175 is not disposed. The light emitting element layer EDL may be disposed on the inclined portion of the light extraction pattern 180, in which the light control pattern 175 is not disposed, at a first thickness, and may be disposed on the bottom surface of the concave portion 181, in which the light control pattern 175 is not disposed, at a second thickness thicker than the first thickness. The light emitting element layer EDL may be disposed above the concave portion 181 of the light extraction pattern 180, in which the light control pattern 175 is disposed, at a third thickness, and the second thickness on the bottom surface of the concave portion 181 in which the light control pattern 175 is not disposed and the third thickness may be the same as each other. The first thickness of the light emitting element layer EDL disposed on the inclined portion of the light extraction pattern 180 in which the light control pattern 175 is not disposed may be smaller than the third thickness above the concave portion 181 of the light extraction pattern 180 in which the light control pattern 175 is disposed.

The light emitting element layer EDL includes two or more light emitting layers for emitting white light. As an example, the light emitting element layer EDL may include first and second light emitting layers for emitting white light by mixing first light with second light. The first light emitting layer may include any one of a blue light emitting layer, a green light emitting layer, a red light emitting layer, a yellow light emitting layer and a yellow-green light emitting layer to emit the first light. The second light emitting layer may include a light emitting layer for emitting the second light to implement white light from the light emitting element EP by mixture with the first light among the blue light emitting layer, the green light emitting layer, the red light emitting layer, the yellow light emitting layer and the yellow-green light emitting layer. The light emitting element layer EDL according to another example may include any one of a blue light emitting layer, a green light emitting layer and a red light emitting layer.

The second electrode E2 may be disposed on the light emitting element layer EDL and thus be directly in contact with the light emitting element layer EDL. The second electrode E2 may have a surface shape that follows the surface shape of the light emitting element layer EDL. The second electrode E2 may be disposed by a deposition process in a conformal shape that follows the surface shape (or morphology) of the light emitting element layer EDL to have the same cross-sectional structure as that of the light emitting element layer EDL.

The second electrode E2 has a shape that follows a concave shape in the concave portion 181 of the light extraction pattern 180 in which the light control pattern 175 is not disposed and has a flat shaped cross-sectional structure in the concave portion 181 of the light extraction pattern 180 in which the light control pattern 175 is disposed. That is, the surface shape of the second electrode E2 substantially matches the surface shape of the light extraction pattern 180 and the light control pattern 175. The second electrode E2 alternately has a concave shape and a flat shape in accordance with the arrangement structure of the light control pattern 175. That is, the second electrode E2 includes a plurality of portions that are disposed within the concave portions 181/281 that lack the light control pattern 175, and a plurality of portions that are not disposed within the concave portions 181/281 that are filled with the light control pattern 175.

Since the second electrode E2 is disposed on the inclined portion of the light extraction pattern 180 in which the light control pattern 175 is not disposed, and is disposed on the upper surface of the light control pattern 175 filled in the concave portion 181 of the adjacent light extraction pattern 180, the light emitted from the light emitting element layer EDL may be reflected by the second electrode E2 disposed on the inclined portion of the light extraction pattern 180, in which the light control pattern 175 is not disposed, without being dissipated after moving to next even though it is refracted by the light control pattern 175.

The organic light emitting display apparatus according to the present disclosure has a light control pattern 175 alternately disposed in the concave portion 181 of the light extraction pattern 180, so that the second electrode E2 is disposed on the inclined portion of the light extraction pattern 180 to prevent the light emitted from the inside from being dissipated or trapped after moving to next and emit the light to the outside after being reflected inside, thereby increasing condensing efficiency to improve light extraction efficiency.

In addition, the organic light emitting display apparatus according to the present disclosure has a light control pattern 175 alternately disposed in the concave portion 181 of the light extraction pattern 180, so that the second electrode E2 is disposed on the inclined portion of the light extraction pattern 180 to have a slope and disposed on the concave portion 181 to alternately have a flat surface.

Since the second electrode E2 is sequentially disposed on the inclined portion of the light extraction pattern 180, the upper surface of the light control pattern 175 on the concave portion 181 and the inclined portion of the adjacent light extraction pattern 180, the incident external light may be reflected three times from the inclined portion of the light extraction pattern 180, the upper surface of the light control pattern 175 on the concave portion 181 and the inclined portion of the adjacent light extraction pattern 180.

When the external light incident by the second electrode E2 is reflected inside three times, since the light may be prevented from being again emitted to the outside, the organic light emitting display apparatus according to the present disclosure may solve reflective visibility due to the external light. Therefore, the organic light emitting display apparatus may prevent or at least reduce black gap due to reflection of the external light, whereby real black may be implemented in a non-driving or off-state.

Since the organic light emitting display apparatus according to the present disclosure may prevent the external light from being again emitted to the outside, Rainbow Mura, which is generated as the external light is refracted while being emitted, may be avoided.

The second electrode E2 may include a metal material having high reflectance to reflect the incident light emitted from the light emitting element layer EDL toward the substrate 100. For example, the second electrode E2 may include a single layered structure or a multi-layered structure, which is made of any one material or an alloy of two or more materials selected from aluminum (Al), silver (Ag), molybdenum (Mo), gold (Au), magnesium (Mg), calcium (Ca) and barium (B a). The second electrode E2 may include an opaque conductive material having high reflectance.

The organic light emitting display apparatus further includes a bank layer 190 for defining the light emission area EA and an encapsulation portion 200 for protecting the light emitting element EP.

The bank layer 190 may be disposed on the edge of the first electrode E1 and on the planarization layer 170. The bank layer 190 may overlap an edge portion of the wavelength conversion layer 150. The bank layer 190 may be made of an organic material such as benzocyclobutene (BCB)-based resin, acrylic resin or polyimide resin. The bank layer 190 may be disposed as a photoresist that includes a black pigment, and in this case, the bank layer 190 may serve as a light shielding member between adjacent pixels.

The bank layer 190 is disposed on the upper surface 170a of the planarization layer 170 to cover the edge of the first electrode E1 extended onto the circuit area CA, and may be disposed to cover the edge of the light extraction pattern 180. The light emission area EA defined by the bank layer 190 may be disposed to have a size narrower than an area of the light extraction pattern 180 of the planarization layer 170.

The encapsulation portion 200 may be disposed on the substrate 100 to cover the light emitting element EP. The encapsulation portion 200 may surround the display area. The encapsulation portion 200 may serve to protect the thin film transistor and the light emitting element EP from external impact and prevent oxygen and/or moisture from being permeated into the light emitting element EP.

The encapsulation portion 200 may include a plurality of inorganic encapsulation layers. The encapsulation portion 200 may further include at least one organic encapsulation layer interposed between the plurality of inorganic encapsulation layers. The organic encapsulation layer may be represented by a particle cover layer.

The encapsulation portion according to another embodiment of the present disclosure may be changed to a filler surrounding the display area, and in this case, the opposite substrate 300 may be bonded to the substrate 100 via the filler. The filler may include a getter material that absorbs oxygen and/or moisture.

The opposite substrate 300 may be coupled to the encapsulation portion 200. The opposite substrate 300 may be made of a plastic material, a glass material or a metal material. For example, when the encapsulation portion 200 includes a plurality of inorganic encapsulation layers, the opposite substrate 300 may be omitted.

Optionally, when the encapsulation portion 200 is changed to the filler, the opposite substrate 300 may be coupled to the filler, and in this case, the opposite substrate 300 may be made of a plastic material, a glass material or a metal material.

Figure 8:
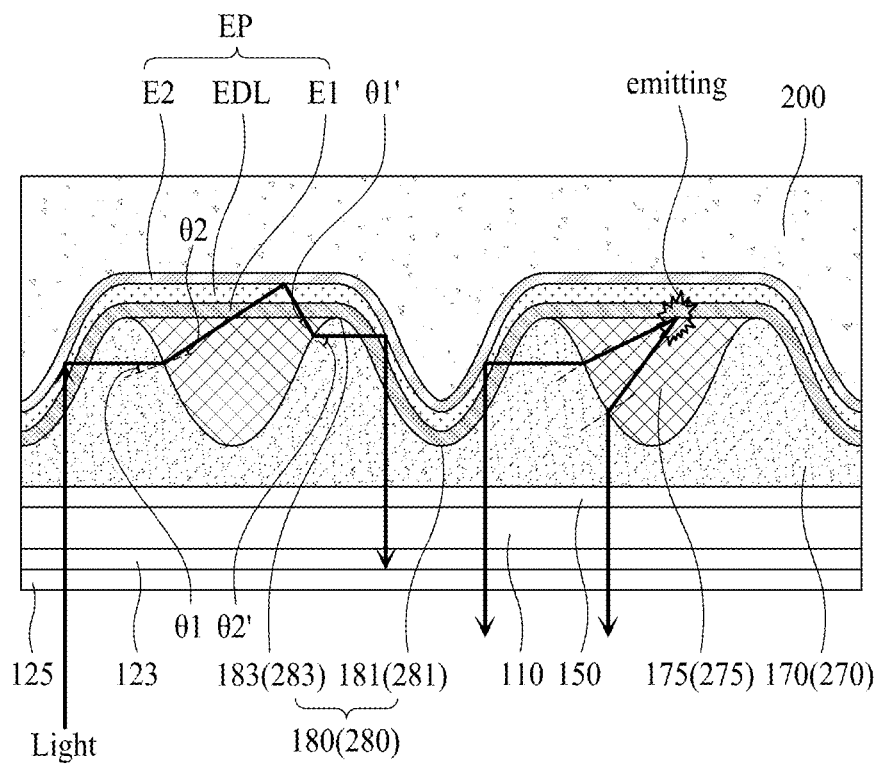
FIG. 8 is a view illustrating an effect of an organic light emitting display apparatus according to one embodiment of the present disclosure.

FIG. 8 is a view illustrating an effect of an organic light emitting display apparatus according to one embodiment of the present disclosure.

When the external light enters the organic light emitting display apparatus from the outside of the organic light emitting display apparatus, the external light is changed to left circularly polarized light or right circularly polarized light through the optical film 120 which includes the phase film 123 and the polarizing film 125. In detail, the external light is changed into linear polarized light while passing through the polarizing film 125, and the linearly polarized light is changed to the left circularly polarized light or the right circularly polarized light while passing through the phase film 123.

First of all, the left circularly polarized light will be described. The first left circularly polarized light is reflected by the second electrode E2 disposed on the inclined portions of the light extraction patterns 180 and 280, in which the light control patterns 175 and 275 are not disposed, and is changed to the first right circularly polarized light. The first right circularly polarized light is refracted by the light control patterns 175 and 275 disposed in the concave portions 181 and 281 of the light extraction patterns 180 and 280 and is again reflected by the flat second electrode E2 on the light control patterns 175 and 275 toward the light emitting element EP, whereby the first right circularly polarized light is changed to the second left circularly polarized light.

At this time, since the light control patterns 175 and 275 have a refractive index greater than that of the planarization layers 170 and 270 having the light extraction patterns 180 and 280, an emission angle θ2 is smaller than an incident angle θ1. Therefore, the first right circularly polarized light is directed in the direction of the light emitting element EP by the second electrode E2 disposed on the inclined portions of the light extraction patterns 180 and 280 in which the light control patterns 175 and 275 are not disposed. The first right circularly polarized light is again reflected by the flat second electrode E2 on the light control patterns 175 and 275 and changed to the second left circularly polarized light.

The second left circularly polarized light is again refracted by the light control patterns 175 and 275 and reflected by the second electrode E2 disposed on the inclined portions of the adjacent light extraction patterns 180 and 280 as the light control patterns 175 and 275 are not disposed in the adjacent light extraction patterns 180 and 280, whereby the second left circularly polarized light is changed to the second right circularly polarized light and directed toward the substrate 100.

At this time, since the light control patterns 175 and 275 have a refractive index greater than that of the planarization layers 170 and 270 having the light extraction patterns 180 and 280, an emission angle θ2' is greater than an incident angle θ1' when the light in the light control patterns 175 and 275 passes through the adjacent light extraction patterns 180 and 280, whereby the second left circularly polarized light may be directed toward the inclined portions of the adjacent light extraction patterns 180 and 280, and may be reflected by the second electrode E2 because the light control patterns 175 and 275 are not disposed in the adjacent light extraction patterns 180 and 280.

The second left circularly polarized light is reflected by the second electrode E2 and changed to the second right circularly polarized light, and a phase of the light directed toward the substrate 100 by second right circularly polarization is changed to 90° so that the light may be prevented from being emitted to the outside by the polarizing film 125.

As another example, the case that the external light is changed to the linearly polarized light while passing through the polarizing film 125 and the linearly polarized light is changed to the right circularly polarized light while passing through the phase film 123 will be described. The first right circularly polarized light is reflected by the second electrode E2 disposed on the inclined portions of the light extraction patterns 180 and 280 in which the light control patterns 175 and 275 are not disposed, and is changed to the first left circularly polarized light. The first left circularly polarized light is refracted by the light control patterns 175 and 275 disposed on the concave portions 181 and 281 of the light extraction patterns 180 and 280, is again reflected by the flat second electrode E2 on the light control patterns 175 and 275 toward the light emitting element EP, and then is changed to the second right circularly polarized light.

At this time, since the light control patterns 175 and 275 have a refractive index greater than that of the planarization layers 170 and 270 having the light extraction patterns 180 and 280, the emission angle Θ2 is smaller than the incident angle Θ1, whereby the first left circularly polarized light is directed toward the light emitting element EP by the second electrode E2 disposed on the inclined portions of the light extraction patterns 180 and 280 in which the light control patterns 175 and 275 are not disposed. The first left circularly polarized light is again reflected by the flat second electrode E2 on the light control patterns 175 and 275 and changed to the second right circularly polarized light.

The second right circularly polarized light is again refracted by the light control patterns 175 and 275, is again reflected by the second electrode E2 disposed on the inclined portion of the adjacent light extraction patterns 180 because the light control patterns 175 and 275 are not disposed in the adjacent light extraction patterns 180 and 280, is changed to the second left circularly polarized light, and is directed toward the substrate 100.

At this time, since the light control patterns 175 and 275 have a refractive index greater than that of the planarization layers 170 and 270 having the light extraction patterns 180 and 280, the emission angle Θ2' is greater than the incident angle Θ1' when the light in the light control patterns 175 and 275 passes through the adjacent light extraction patterns 180 and 280, whereby the second right circularly polarized light may be directed toward the inclined portions of the adjacent light extraction patterns 180 and 280, and may be reflected by the second electrode E2 because the light control patterns 175 and 275 are not disposed in the adjacent light extraction patterns 180 and 280.

The second right circularly polarized light is again reflected by the second electrode E2 and changed to the second left circularly polarized light, and a phase of the light directed toward the substrate 100 by second left circularly polarization is changed to 0° by the phase film 123, whereby the light may be prevented from being emitted to the outside by the polarizing film 125.

As described above, in the organic light emitting display apparatus according to the present disclosure, the incident light and the emission light of the external light have their respective phases different from or opposite to each other, so that the external light does not pass the display apparatus by the optical film 120 having the polarized film 125, thereby preventing or at least reducing the external light from being emitted.

In the organic light emitting display apparatus according to the present disclosure, the light control patterns 175 and 275 are alternately disposed in the concave parts 181 and 281 of the light extraction patterns 180 and 280, so that the incident external light is reflected inside three times by the second electrode E2 and prevented from being emitted, whereby reflective visibility due to the external light may be solved. Therefore, the organic light emitting display apparatus may prevent black gap due to reflection of the external light from occurring, thereby implementing real black in a non-driving or off-state.

The light emitted from the light emitting element EP in the organic light emitting display apparatus is emitted toward the substrate 100 or refracted by the light control patterns 175 and 275 filled in the concave portions 181 and 281 of the light extraction patterns 180 and 280, and the refracted light is directed toward the adjacent light extraction patterns 180 and 280 or the substrate 100.

When the refracted light is directed toward the adjacent light extraction patterns 180 and 280, the light control patterns 175 and 275 are not disposed in the concave portions 181 and 281 of the adjacent light extraction patterns 180 and 280, so that the second electrode E2 is disposed on the inclined portions of the adjacent light extraction patterns 180 and 280. The light refracted by the light control patterns 175 and 275 is reflected by the second electrode E2 disposed on the inclined portions of the adjacent light extraction patterns 180 and 280, is directed toward the substrate and then is emitted to the outside. In this case, since the light emitted from the light emitting element EP is not polarized light, its phase is not changed even though the light is reflected by the second electrode E2, so that the light may be emitted to the outside without being blocked by the optical film 120.

In the organic light emitting display apparatus according to the present disclosure, the light control patterns 175 and 275 are alternately disposed in the concave parts 181 and 281 of the light extraction patterns 180 and 280, whereby the light emitted from the light emitting element EP may be prevented from being dissipated or trapped by movement to next, and may be reflected inside and emitted to the outside.

As described above, the organic light emitting display apparatus according to the present disclosure may improve light extraction efficiency by increasing condensing efficiency.

Figure 9A:
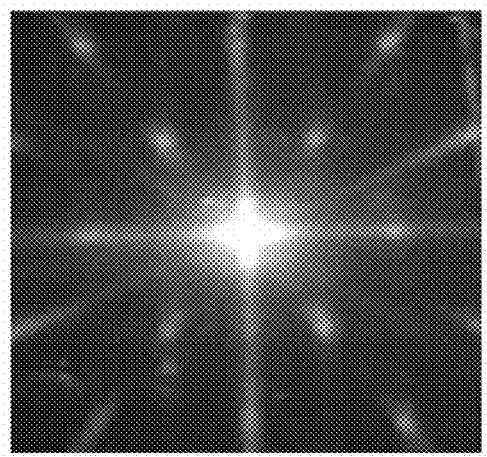
FIG. 9A is a photo illustrating a comparative example.
Figure 9B:
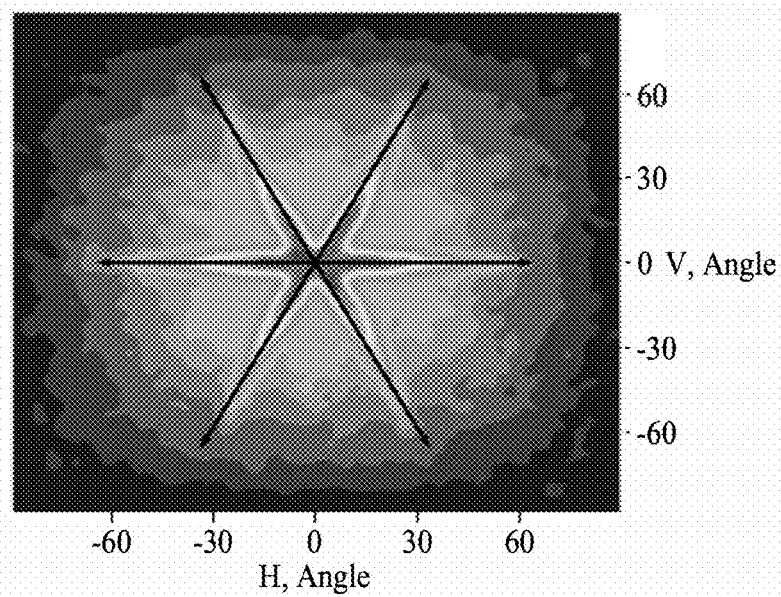
FIG. 9B illustrates simulation data of a comparative example.

As shown in FIG. 9A, in an organic light emitting display apparatus according to a comparative example, external light is reflected inside the display apparatus and is refracted while being emitted to the outside of the display apparatus, whereby Rainbow Mura may occur. As a result of simulation of the organic light emitting display apparatus according to the comparative example, strong luminance of a red color occurs at the center and is spread in a star shape as shown in FIG. 9B. In this way, it is noted that the result of simulation in FIG. 9b is similar to a photo of the organic light emitting display apparatus according to the comparative example in FIG. 9a, which shows strong reflective visibility and Rainbow Mura.

Figure 10:
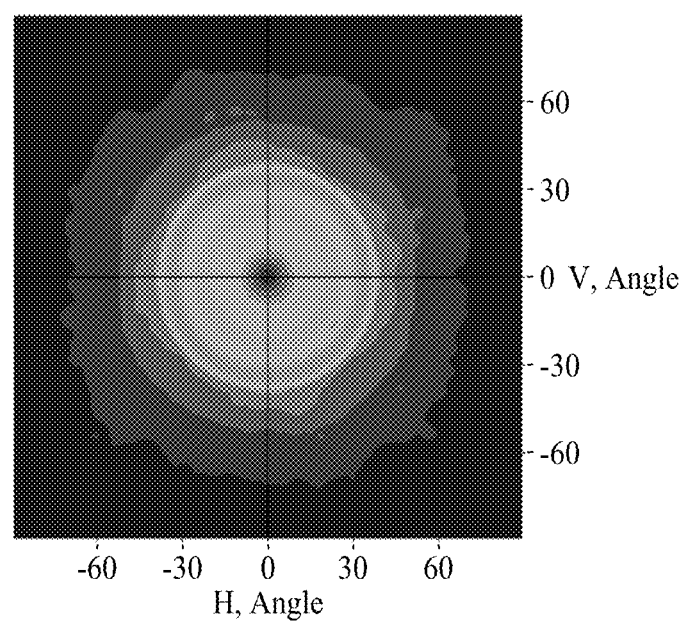
FIG. 10 illustrates simulation data of an organic light emitting display apparatus according to the embodiments of the present disclosure.

On the other hand, in the organic light emitting display apparatus according to the present disclosure, as a result of simulation of FIG. 10, luminance distribution in the form of a wide concentric circle occurs without having a red color at the center. In the organic light emitting display apparatus according to the present disclosure, it is noted that the light may be prevented from being emitted while being reflected three times inside the display apparatus even though the external light enters the display apparatus, and luminance may be prevented from being strongly concentrated on the center only and may be widely spread in the form of a concentric circle to lower visually perceived intensity. Therefore, in the organic light emitting display apparatus according to the present disclosure, reflective visibility due to the external light may be solved, and Rainbow Mura may be solved.

Figure 11:
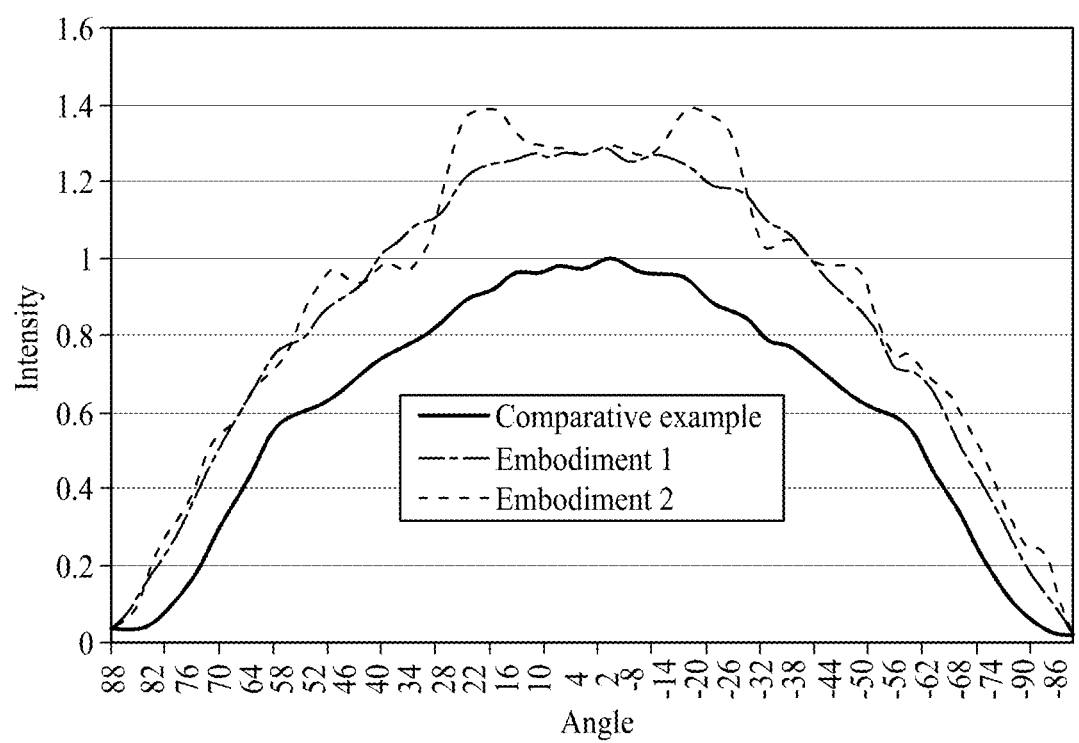
FIG. 11 is a graph illustrating light efficiency of an organic light emitting display apparatus according to the embodiments of the present disclosure.

As described above, in the organic light emitting display apparatus according to the present disclosure, the external light reflected inside may be prevented or at least reduced from being emitted and at the same time the light emitted from the organic light emitting layer and trapped inside the organic light emitting display apparatus may be emitted to the outside. As shown in FIG. 11, in the organic light emitting display apparatus according to one embodiment (Embodiment 1) and another embodiment (Embodiment 2) of the present disclosure, it is noted that light efficiency is improved as much as 29% based on a viewing angle of 0 in comparison with the organic light emitting display apparatus according to the comparative example.

According to the present disclosure, the following advantageous effects may be obtained.

In the organic light emitting display apparatus according to the present disclosure, light extraction efficiency of the light emitted from the organic light emitting element may be improved.

The organic light emitting display apparatus according to the present disclosure may solve reflective visibility due to reflection of the external light, may prevent black gap from occurring, and may implement real black in a non-driving or off-state.

The organic light emitting display according to the present disclosure may solve a problem of Rainbow Mura.

It will be apparent to those skilled in the art that the present disclosure described above is not limited by the above-described embodiments and the accompanying drawings and that various substitutions, modifications and variations may be formed in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. An organic light emitting display apparatus comprising:
a subpixel including a light emission area, the subpixel configured to emit light in the light emission area;
a planarization layer that overlaps the light emission area, the planarization layer including a plurality of light extraction patterns having a plurality of convex portions and a plurality of concave portions;
a light control pattern alternately disposed in the plurality of concave portions of the plurality of light extraction patterns;
a light emitting element disposed on the plurality of light extraction patterns and the light control pattern; and
a substrate beneath the light emitting element,
wherein the plurality of convex portions extend away from the substrate,
wherein each convex portion is disposed between a pair of concave portions from the plurality of concave portions.

2. The organic light emitting display apparatus of claim 1, wherein the light control pattern fills a subset of the plurality of concave portions to alternately planarize upper surfaces of the subset of the plurality of concave portions.

3. The organic light emitting display apparatus of claim 1, wherein the light control pattern has a refractive index that is greater than a refractive index of the planarization layer.

4. The organic light emitting display apparatus of claim 1, wherein a virtual line connecting central portions of four adjacent concave portions on a plane forms a square shape, a rhombus shape, or a diamond shape.

5. The organic light emitting display apparatus of claim 4, wherein any two corners connected to each other in a line have different structures, and any two corners that are not connected to each other in the line have a same symmetrical structure in the virtual line.

6. The organic light emitting display apparatus of claim 4, wherein the light control pattern is disposed in one concave portion of the concave portions of any two corners connected to each other in a line, but is not disposed in the other concave portion in the virtual line.

7. The organic light emitting display apparatus of claim 4, wherein the light control pattern is disposed in both concave portions of any two corners facing each other based on a diagonal direction or is not disposed in both concave portions of any two corners facing each other based on an opposite diagonal direction of the diagonal direction in the virtual line.

8. The organic light emitting display apparatus of claim 1, wherein the light control pattern fills a first concave portion from the plurality of concave portions to planarize the first concave portion, but is not disposed in a second concave portion from the plurality of concave portions that is immediately adjacent to the first concave portion.

9. The organic light emitting display apparatus of claim 1, wherein the light control pattern is non-overlapping with another light control pattern disposed in a next row or an adjacent row in a first direction.

10. The organic light emitting display apparatus of claim 9, wherein the light control pattern is non-overlapping with another light control pattern disposed in a next column or adjacent column in a second direction perpendicular to the first direction.

11. An organic light emitting display apparatus comprising:

a subpixel including a light emission area, the subpixel configured to emit light in the light emission area;

a planarization layer that overlaps the light emission area, the planarization layer including a plurality of light extraction patterns having a plurality of convex portions and a plurality of concave portions;

a light control pattern alternately disposed in the plurality of concave portions of the plurality of light extraction patterns; and a light emitting element disposed on the plurality of light extraction patterns and the light control pattern, wherein the light emitting element has a surface shape that substantially matches a surface shape of a light extraction pattern from the plurality of light extraction patterns and the light control pattern, and is disposed on an inclined portion of the light extraction pattern while having a concave shape in the plurality of concave portions of the light extraction pattern in which the light control pattern is not disposed, and has a flat upper surface in the plurality of concave portions of the light extraction pattern in which the light control pattern is disposed.

12. The organic light emitting display apparatus of claim 11, wherein the light emitting element alternately has the concave shape and a flat shape.

13. The organic light emitting display apparatus of claim 11, wherein the light emitting element includes a first electrode, a light emitting element layer, and a second electrode, and wherein the second electrode has a surface shape that substantially matches the surface shape of the light extraction pattern and the light control pattern, is disposed on the inclined portion of the light extraction pattern while having a concave shape in the plurality of concave portions of the light extraction pattern in which the light control pattern is not disposed, and has a flat upper surface in the plurality of concave portions of the light extraction pattern in which the light control pattern is disposed.

14. The organic light emitting display apparatus of claim 13, wherein external light that enters the organic light emitting display apparatus from outside of the organic light emitting display apparatus is reflected a plurality of times by the second electrode.

15. The organic light emitting display apparatus of claim 14, wherein the external light is reflected by the second electrode disposed on the inclined portion of the light extraction pattern in the organic light emitting display apparatus, is again reflected by the second electrode disposed on the flat upper surface of the concave portion of the light extraction pattern in which the light control pattern is disposed, and is reflected by the second electrode disposed on an inclined portion of a concave portion of an adjacent light extraction pattern in which the light control pattern is not disposed.

16. The organic light emitting display apparatus of claim 13, further comprising:

a substrate disposed in a direction in which light of the light emitting element is emitted;

a phase film attached to the substrate in the direction in which the light is emitted; and a polarizing film attached to the phase film in the direction in which the light is emitted.

17. The organic light emitting display apparatus of claim 16, wherein external light that enters the organic light emitting display apparatus from outside of the organic light emitting display apparatus is first left circularly polarized by the phase film, the first left circularly polarized light is reflected by the second electrode disposed on the inclined portion of the light extraction pattern, in which the light control pattern is not disposed, and is changed to first right circularly polarized light, the first right circularly polarized light is reflected by the second electrode, which is flat and disposed on an upper surface of the light control pattern disposed on the concave portion of the light extraction pattern, and is changed to second left circularly polarized light, the second left circularly polarized light is reflected by the second electrode disposed on an inclined portion of an adjacent light extraction pattern, in which the light control pattern is not disposed, and is changed to second right circularly polarized light, and the second right circularly polarized light is prevented from being emitted by the polarizing film.

18. An organic light emitting display apparatus comprising:

a subpixel including a light emission area, the subpixel configured to emit light in the light emission area;

a planarization layer that overlaps the light emission area, the planarization layer including a plurality of light extraction patterns having a plurality of convex portions and a plurality of concave portions;

a light control pattern alternately disposed in the plurality of concave portions of the plurality of light extraction patterns; and a light emitting element disposed on the plurality of light extraction patterns and the light control pattern, wherein the light emitting element includes a first electrode, a light emitting element layer, and a second electrode, and the light emitting element layer is disposed on an inclined portion of a light extraction pattern from the plurality of light extraction patterns, in which the light control pattern is not disposed, at a first thickness, and is disposed on a bottom surface of the concave portion, in which the light control pattern is not disposed, at a second thickness that is thicker than the first thickness.

19. The organic light emitting display apparatus of claim 18, wherein the light emitting element layer is disposed above the concave portion of the light extraction pattern, in which the light control pattern is disposed, at a third thickness, and the second thickness and the third thickness are the same as each other.

20. A display apparatus comprising:

a substrate including a light emitting area;

a subpixel on the substrate, the subpixel including a light emitting element configured to emit light in the light emitting area toward the substrate;

a planarization layer in the light emitting area, the planarization layer including a plurality of concave portions that extend toward the substrate and overlap the light emitting element; and a light control pattern disposed in a first plurality of concave portions from the plurality of concave portions but is not disposed in a second plurality of concave portions from the plurality of concave portions, wherein the planarization layer further includes a plurality of convex portions that extend away from the substrate, each convex portion disposed between a pair of concave portions from the plurality of concave portions.

21. The display apparatus of claim 20, wherein the light control pattern has a refractive index that is greater than a refractive index of the planarization layer.

22. The display apparatus of claim 21, wherein a concave portion from the first plurality of concave portions that is filled with the light control pattern is disposed between a pair of concave portions from the second plurality of concave portions that is not filled with the light control pattern.

23. The display apparatus of claim 22, wherein the concave portion from the first plurality of concave portions and the pair of concave portions from the second plurality of concave portions are arranged in a same row or a same column in a plane view of the display apparatus.

* * * * *